US 6,750,440 B1

United States Patent
Leggett et al.

(10) Patent No.: US 6,750,440 B1
(45) Date of Patent: Jun. 15, 2004

(54) OPTO-ELECTRICAL ACTUATION SYSTEM AND METHOD

(76) Inventors: Derek Nigel Leggett, Field Cottage, Wonston, Winchester, Hampshire, SO21 3LS (GB); James McInnes, 11 Priors Dean Road, Harestock, Winchester, Hampshire SO22 6JT (GB)

(*) Notice: Subject to any disclaimer, the term of this patent is extended or adjusted under 35 U.S.C. 154(b) by 90 days.

(21) Appl. No.: 10/009,866
(22) PCT Filed: Jun. 9, 2000
(86) PCT No.: PCT/GB00/02265
§ 371 (c)(1), (2), (4) Date: Jul. 22, 2002
(87) PCT Pub. No.: WO00/77932
PCT Pub. Date: Dec. 21, 2000

(30) Foreign Application Priority Data
Jun. 12, 1999 (GB) .............................................. 9913600

(51) Int. Cl.[7] ................................................. G06M 7/00
(52) U.S. Cl. ........................................ 250/221; 327/514
(58) Field of Search ............................. 250/221, 222.1, 250/214 SW; 327/514; 398/94, 110, 113, 120, 139

(56) References Cited

U.S. PATENT DOCUMENTS 5,285,305 A * 2/1994 Cohen et al. ................... 398/31

* cited by examiner

Primary Examiner—David Porta
Assistant Examiner—Patrick J. Lee
(74) Attorney, Agent, or Firm—Law Offices of Royal W. Craig

(57) ABSTRACT

A selective optical actuation system for a plurality of electrical devices (20) comprises a variable pulse frequency pulsed light source (10) and an optical fibre network (12, 13, 14) distributing the light pulses to actuation gateway for each device, comprising a photovoltaic converter (16) whose correspondingly pulsed electrical output is applied to a ferroelectric transformer (18). Only if the pulse frequency is within the resonant band for a given transformer will the voltage be raised above a threshold value required to actuate that device. Choice of light pulse frequency thereby determines the device(s) to be actuated.

10 Claims, 1 Drawing Sheet

OPTO-ELECTRICAL ACTUATION SYSTEM AND METHOD

Figure 1:
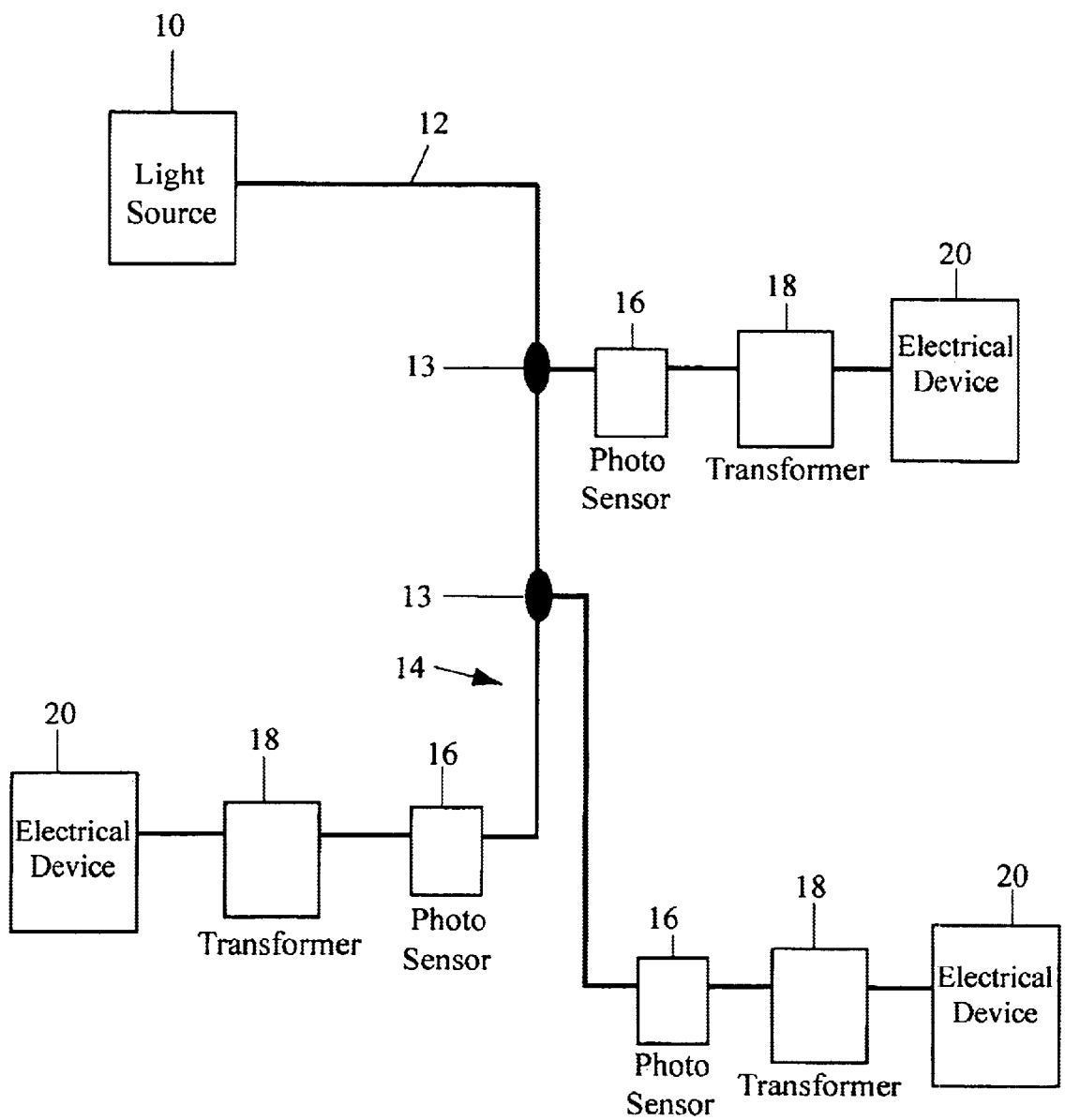

This invention relates to an opto-electrical actuation system and method. Specifically, it relates to a system and method in which light is used to selectively actuate and control a plurality of electrical devices. References to actuation herein are intended to include controlling and/or supplying operating power to the devices.

The system and method in accordance with the invention are intended to supply electrical power at an effective actuating voltage selectively to one or more of a plurality of devices. The power may be used to switch the devices, or to supply running power to them, according to the demands of the devices and the availability of other electrical power sources.

The invention is particularly suitable for downhole use at oil and gas exploration and production sites, in environments where temperatures can reach up to 300° C.

In accordance with one aspect of the invention, there is provided an actuation system for a plurality of electrically actuated devices, comprising a pulsed light source of variable pulse frequency directed to a plurality of actuation gateways each adapted to supply an electrical actuation voltage above a threshold value to an associated device when illuminated by light pulsed at a trigger frequency for that device.

Each said gateway is suitably provided with an optical sensor such as photovoltaic converter means for converting pulsed incident light to a low voltage pulsed electrical current in the order of 3 to 5 volts, of corresponding frequency. Frequency sensitive ferroelectric DC-DC converter means may be provided for transforming the low voltage of the pulsed current to a higher voltage above the threshold value, typically 600–800 volts, for the associated device when the current frequency is at the trigger frequency. The DC-DC converter means may be a ferroelectric transformer and the trigger frequency is then suitably a resonant frequency of the transformer selectably adjusted by variation in the component geometry. In some embodiments of the invention output voltages for the converter as low as 100 volts may be adequate to activate the associated device.

The trigger frequency may be in a band of not more than about 3 kHz within the range 10 kHz to 40 kHz. The trigger frequencies of ferroelectric transformers to be operated independently are suitably separated to compensate for environmental effects, such as pressure and temperature, by a frequency difference of about 3 kHz or more.

The system desirably includes optical pathway means for directing light from the light source to the plurality of actuation gateways. The optical pathway means may comprise a branched network of optical fibres connected by optical couplers. The coupler splitting ratios may be selected to provide optimum power to the devices to be actuated. Such ratios will depend upon the number of devices on the network and the available light source power. Typical optical coupling splitting ratios are in the order of 5:1 and are so selected as to provide optical power in the order of 40 to 50 mW to the photovoltaic converter. The optical couplers should also be selected from materials suitable for the elevated thermal conditions of the surrounding environment. A sufficient optical power budget should be provided to accommodate changes in splitting ratio and photovoltaic conversion efficiency under the changing environmental conditions.

The invention further provides a method of actuating a plurality of electrical devices which comprises providing an actuating system for the said devices as set out above, and selectively actuating a device by illuminating the actuation gateways with light pulsed at a frequency that corresponds to the trigger frequency of the selected device.

One embodiment of the invention is illustrated by way of example in the accompanying drawing, which illustrates diagrammatically an actuation and control system in accordance with the invention.

As shown in the drawing, a single light source 10 is connected to an optical fibre backbone 12, along which a series of optical couplers 13 make optical connection between the backbone fibre and branch fibres 14. Light pulsed from the light source is conducted by the optical network (12, 13, 14) throughout the system.

Branch fibres 14 deliver light to actuation gateways each associated with an electrical device 20. Each gateway comprises a photovoltaic converter 16 and a ferroelectric transformer 18. The devices 20 could be, for example, pilot valves, solenoid valves, motors and electrically powered instrumentation.

Each photovoltaic transformer 18 has a natural resonant frequency range of, typically, 3 kHz or less. When provided with pulsed electrical current at a resonant frequency, the transformer increases the voltage to a value that is above a threshold value required to actuate the electrical device 20. If pulsed current is supplied to the transformer 18 at a frequency outside its resonant trigger frequency range, the voltage increase is low, and does not reach the threshold value.

The photovoltaic converter 16 at each gateway responds to incident light transmitted over the optical network from light source 10 and converts it into electrical current of a corresponding pulse frequency. Accordingly, the pulse frequency of the light emitted by the light source determines the frequency of the electrical current applied to all the transformers 18 in the system at the same time.

In accordance with the invention, electrical devices 20 that are intended to operate simultaneously are associated with actuation gateways in which the transformers 18 have similar resonant trigger frequencies, and electrical devices that are intended to operate independently are provided with actuation gateways in which the transformers have distinctly different resonant frequencies. In this way, the devices to be actuated can be selected by appropriate selection of the pulse frequency at the light source.

Typical operating frequencies of a series of devices in accordance with the invention are 13–16 kHz for the first device, 19–22 kHz for the second device, and so on, with each device having a 3 kHz trigger frequency band with a 3 kHz separation between bands.

As an example, the output voltage of the photovoltaic converters 16 may be from 3 to 5 volts. If, and only if, the light pulse frequency is such as to produce an electrical frequency in the resonant trigger band of the transformer 18, the transformer output may be 600–800V, sufficient to actuate the associated electrical device.

What is claimed is:

1. An actuation system for a plurality of electrically actuated devices, comprising a pulsed light source of variable pulse frequency directed to a plurality of actuation gateways; each gateway being adapted to supply an actuation voltage above a threshold value to an associated device when illuminated by light pulsed at a trigger frequency for that device; each said gateway comprising photovoltaic converter means for converting pulsed incident light to a pulsed electric current of corresponding frequency; and each said gateway comprising frequency-sensitive transformer means for transforming the voltage of the pulsed current to a higher voltage above the threshold value for the associated device when the current frequency is at a trigger frequency.

2. A system according to claim 1 wherein the transformer means comprises a ferroelectric transformer and the trigger frequency is a resonant frequency of that transformer.

3. A system according to claim 1 wherein the output voltage of the photovoltaic converter means is 3 to 5 volts.

4. A system according to claim 1 wherein the higher voltage is 600 to 800 volts.

5. A system according to claim 1 in which the trigger frequency is a band of not more than about 3 kHz within the range 10 kHz–40 kHz.

6. A system according to claim 1 in which the trigger frequencies of devices to be operated independently are separated by at least 3 kHz.

7. A system according to claim 1 comprising optical pathway means for directing light from the light source to the plurality of actuation gateways.

8. A system according to claim 7 wherein the optical pathway means comprises a branched network of optical fibers connected by optical couplers.

9. A system according to claim 8 wherein the optical couplers provide optical power of 40 to 50 mW to each actuation gateway.

10. A method of actuating a plurality of electrical devices, comprising providing an actuation system for the said devices according to claim 1, and selectively actuating a device by illuminating the actuation gateways with light pulsed at a frequency that corresponds to the trigger frequency of the selected device.

* * * * *

UNITED STATES PATENT AND TRADEMARK OFFICE
CERTIFICATE OF CORRECTION

PATENT NO.   : 6,750,440 B1  
DATED        : June 15, 2004  
INVENTOR(S)  : Leggett, Nigel Derek and McInnes, James It is certified that error appears in the above-identified patent and that said Letters Patent is hereby corrected as shown below:

<u>Title page,</u>
Item [76], Inventors, "Derek Nigel Leggett" should read -- Nigel Derek Leggett --

Signed and Sealed this

Sixteenth Day of November, 2004

JON W. DUDAS
*Director of the United States Patent and Trademark Office*